United States Patent [19]

Taylor

[11] 3,866,214

[45] Feb. 11, 1975

[54] SYNCHRO-TO-DIGITAL CONVERTER

[75] Inventor: Sidney A. Taylor, Silver Spring, Md.

[73] Assignee: The United States of America as represented by the Secretary of the Navy, Washington, D.C.

[22] Filed: Oct. 5, 1973

[21] Appl. No.: 404,063

[52] U.S. Cl....... 340/347 SY, 318/600, 340/347 AD

[51] Int. Cl.......................... G08c 9/00, H03k 13/02

[58] Field of Search............... 340/347 SY, 347 AD; 318/560, 595, 600, 603, 605, 606, 608, 615, 636, 562

[56] References Cited

UNITED STATES PATENTS

| | | | |
|---|---|---|---|
| 3,136,987 | 6/1964 | Bock et al. | 340/347 SY |
| 3,286,254 | 11/1966 | Brendes et al. | 340/347 SY |
| 3,490,016 | 1/1970 | Taylor | 340/347 SY |
| 3,573,793 | 4/1971 | Kihlberg et al. | 340/347 SY |
| 3,651,514 | 3/1972 | Klatt | 340/347 SY |
| 3,676,659 | 7/1972 | Asmussen | 340/347 SY |

*Primary Examiner*—Thomas J. Sloyan

[57] ABSTRACT

Analog output signals from a synchro stator winding are converted to binary form by gating each analog signal with a relatively high frequency square wave which is shifted in phase by an amount equal to the physical phase displacement of its associated stator winding. These signals are then summed, filtered and limited to form a signal which is phase shifted in proportion to the synchro shaft angle. Comparing this phase shifted signal with a fixed reference signal provides a gated signal with pulse widths proportional to synchro angle. These pulses may then be converted to a binary signal containing angular information.

7 Claims, 4 Drawing Figures

PATENTED FEB 1 1 1975 3,866,214

SHEET 1 OF 2

PATENTED FEB 11 1975

3,866,214

SYNCHRO-TO-DIGITAL CONVERTER

BACKGROUND OF THE INVENTION

This invention relates to apparatus for converting analog signals from a synchro generator or other rotating device into digital signals.

Whenever it is desired to obtain angular rotation information concerning a particular item of rotating equipment, it is common practice to utilize a synchro generator. A synchro generator, or more simply a synchro, produces three-phase alternating voltage signals, the phase (either 0° or 180°) and magnitude of which represent, and precisely identify, the angular position of the synchro shaft. Fortunately most synchros produce only three such analog signals, because the various schemes to convert these signals into digital form provide more than enough complexity. One method of conversion is to utilize specialized transformers having windings with predetermined turns ratios. Perhaps the most common synchro to digital converter involves apparatus commonly called a resolver. This device reduces the phase measurement problem to a relationship between only two signals, a sine and a cosine. This relationship is then solved trigonometrically to obtain the desired angular information.

Most conventional synchros utilize a 400 Hz signal applied to the rotor, this frequency then obtains throughout the synchro secondary or stator circuits and the following converter circuitry. However, it is very often desirable to have the stator circuits and subsequent conversion circuits independent of this 400 Hz rotor signal. As mentioned previously, it has been the hallmark of past synchro to digital converters to be very complicated and hence costly. There are also many applications where more than one synchro is in use in the same system, thereby requiring an equal number of synchro to digital converters.

It is therefore an object of the invention to provide a simple means for performing synchro to digital conversion.

It is another object of the invention to provide conversion apparatus employing only solid state active elements.

It is a further object of the invention to provide a conversion circuit which is independent of the synchro rotor input signal frequency.

It is still a further object of the invention to provide conversion apparatus which will accommodate input signals from more than one synchro.

SUMMARY OF THE INVENTION

The invention accepts the three output signals from a conventional synchro and converts these into binary coded decimal form. By using multiplexers in the three input lines, the invention may handle more than one group of synchro signals by converting them sequentially into binary coded decimal form. Essentially, the conversion is accomplished by chopping the three synchro signals with three square waves having a much higher frequency than the rotor input signal frequency. If the rotor input signal frequency is 400 Hz, the square wave frequency should be high enough to give adequate resolution when chopping, in this case 10 KHz is sufficient. The three square waves must be out of phase with each other by exactly 120°. This electrical out of phase condition must agree with the physical phase displacement of the synchro output windings. For example, in a resolver the windings are 90° out of phase and, hence, the electrical phase difference between the higher frequency chopping square waves must equal that same 90°.

This requirement, that the relative electrical phase of the chopping or multiplying signals agree with the relative physical phase of the stator windings, is an important feature of the present invention. This may be better understood by examining the mathematical expressions of the electrical signals involved. The three synchro output signals may be expressed as:

$$S_1 = A(\sin \theta)(\sin \omega_o t) \quad (1)$$

$$S_2 = A(\sin \theta + 120°)(\sin \omega_o t) \quad (2)$$

$$S_3 = A(\sin \theta\ 240°)(\sin \omega_o t) \quad (3)$$

where, $A$ = voltage amplitude $\omega_o$ = 400 Hz rotor input frequency expressed in radians/second $\theta$ = synchro shaft angle of rotation.

It may be seen that sin $\theta$ function amplitude modulates the 400 Hz carrier signal and three equal signals separated by 120° are produced. In other words, the amplitude of each of these three signals will vary as the synchro shaft rotates and each signal will be either inphase or out of phase with a zero reference. However, as is well-known, summing these three signals in order to obtain a properly referenced measure of the shaft angle $\theta$, which is contained in the amplitude modulation of these waves, always results in a signal of zero amplitude. The present invention solves this problem by multiplying or chopping the synchro signals with a second set of carrier signals having the same relative phase relationship but being of substantially higher frequency than the 400 Hz carrier. The phase of these chopping signals relative to each other must match the relative phase of the three synchro signals and the phase of the signals being multiplied together will also then agree. These phase relationships must agree, since it is in this manner that the shaft angle information is transposed from the amplitude modulation to the phase of the higher frequency chopping signal. This may be shown by the following mathematical expressions showing the effects of multiplying the two signals together.

$$S_1' = A(\sin \theta)(\sin \omega_o t)(\sin \omega_1 t) \quad (4)$$

$$S_2' = A(\sin \theta + 120°)(\sin \omega_o t)(\sin \omega_1 t + 120°) \quad (5)$$

$$S_3' = A(\sin \theta + 240°)(\sin \omega_o t)(\sin \omega_1 t + 240°) \quad (6)$$

where $\omega_1$ represents the higher frequency (10 KHz) of the chopping signal in radians per second. Performing this trigonometric multiplication yields a further set of three signals.

$$S_1' = A/2[\cos(\theta-\omega_1 t)-\cos(\theta+\omega_1 t)]\sin\omega_o t \quad (7)$$

$$S_2' = A/2[\cos(\theta+120°-\omega_1 t-120°)-\cos(\theta+120°+\omega_1 t+120°)]\text{-}\sin\omega_o t \quad (8)$$

$$S_3' = A/2[\cos(\theta+240°-\omega_1 t-240°)-\cos(\theta+240°+\omega_1 t+240°)]\text{-}\sin\omega_o t \quad (9)$$

Combining and rewriting these expressions yields:

$$S_1' = A/2\sin\omega_o t[\cos(\theta-\omega_1 t)]-A/2\sin\omega_o t[\cos(\theta+\omega_1 t)] \quad (10)$$

$$S_2' = A/2\sin\omega_o t[\cos(\theta-\omega_1 t)]-A/2\sin\omega_o t[\cos(\theta+\omega_1 t+240°)] \quad (11)$$

$$S_3' = A/2\sin\omega_o t[\cos(\theta-\omega_1 t)]-A/2\sin\omega_o t[\cos(\theta+\omega_1 t+120°)] \quad (12)$$

As noted earlier summing three signals displaced in phase one from another by 120° produces a signal of zero amplitude. Summing equations (10), (11) and (12) then yields:

$$S_1' + S_2' + S_3' = 3/2\ A \sin \omega_o t[\cos(\theta - \omega_1 t)] \quad (13)$$

From this analysis it is clear that there is produced a summed signal having a non-zero constant amplitude and having a phase angle of $\theta$ relative to the 400 Hz reference signal. This phase angle $\theta$ is also the measure of the synchro shaft angle of rotation. In other words, as $\theta$ changes, the phase of the 10 KHz carrier changes relative to the reference, and this phase change may then be measured and processed into a usable form. More specifically, the summed signal of equation (13) is then filtered and limited to provide a signal having the square wave frequency (10 KHz), and with the phase shifted in proportion to the synchro shaft angle. Comparing this to a fixed square wave reference signal provides a gate signal having a pulse width which is now in proportion to the synchro shaft angle. This signal is then used to gate a basic clock frequency, 20 MHz, to produce a pulse train signal which can then be applied to a properly scaled binary coded decimal counter.

DESCRIPTION OF THE PREFERRED EMBODIMENT

Figure 1:
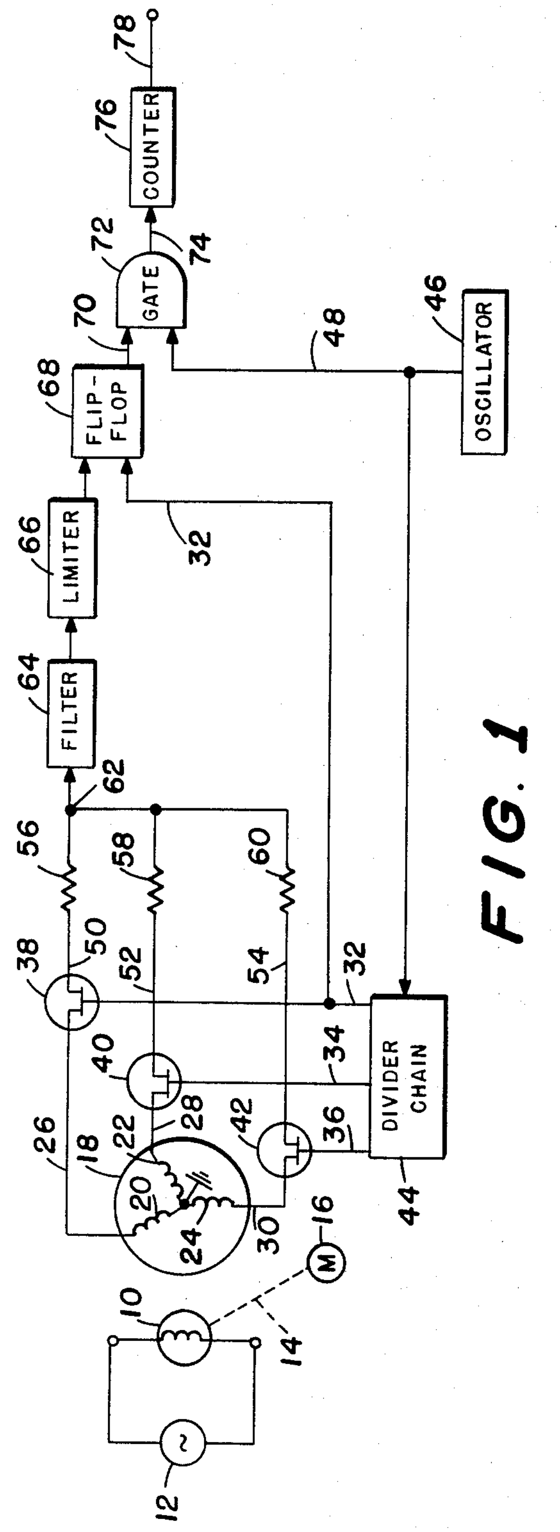
FIG. 1 is a block diagram showing one of the preferred embodiments of the invention.

Referring to FIG. 1, apparatus according to the invention is shown, in block diagram form, receiving three typical synchro output signals. A conventional synchro consists of a wound rotor 10 on which is impressed some alternating voltage, usually at 400 Hz, by a sine wave generator 12 or the like. The rotor 10 is mechanically connected by a shaft 14 to an antenna drive motor 16 or some other rotating device. Comprising the remainder of the synchro is a stator portion 18 consisting of three windings or secondaries 20, 22, 24 which are physically displaced 120° apart inside the stator 18. These windings 20, 22, 24 will produce three sine wave signals on lines 26, 28 and 30 respectively. These signals will each have as a component, a phase angle, which when analyzed, will indicate the physical phase or angular rotation of the rotor shaft 14. All conventional synchros produce signals such as these three 26, 28 and 30 and they will be at the frequency of the voltage impressed upon the wound rotor 10 by the voltage source 12. Conversion is performed by the invention by modulating or chopping these three signals 26, 28 and 30 with three other signals, shown on lines 32, 34, and 36, which are electrically displaced in phase by an amount equal to the physical displacement of the stator 18 windings, and are of a frequency much greater than that of the rotor voltage source 12. This chopping or modulation may be accomplished by use of switches comprised of field effect transistors 38, 40 and 42. The switching signals 32, 34 and 36 are produced by a frequency division unit commonly referred to as a divider chain 44. The divider chain 44 will be driven by a 40 MHz oscillator 46 which also produces an output signal on line 48.

Figure 3:
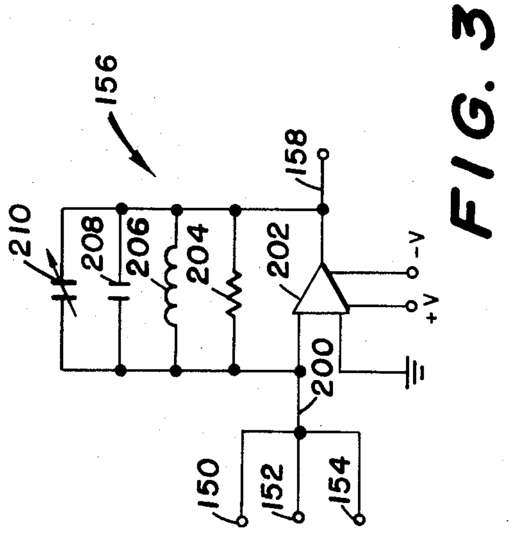
FIG. 3 is a schematic diagram of a typical active filter used in a preferred embodiment of the invention.

The divider chain 44 is chosen so that its output signals 32, 34, 36 are 120° out of phase with each other and have a frequency given by 40 MHz divided by 3,600. The figure 3,600 is derived from the fact that it is normally desired to indicate a tenth of a degree of angular rotation, thereby requiring a circle to be divided into 3,600 equal parts. Thus the output signals 32, 34, 36 from the divider chain 44 are of frequency equal to 11.1 KHz (or nominally 10 KHz) and are fed to the gate electrode of the field effect transistors 38, 40, 42 respectively. The signals out of these switches 38, 40, 42 on lines 50, 52 and 54 are fed to a summing network comprised of resistors 56, 58 and 60. The summing network output signal, at node 62, is then a constant amplitude, phase-varying signal, having a phase shift proportional to the synchro shaft 14 angle. This signal 62 is first fed through a filter 64, then through a limiter or pulse shaper 66 which squares the shape of the pulses. The phase-varying signal at node 62, which has now been filtered and shaped, is fed to a flip-flop 68 which has as its other input one of the nominal 10 KHz modulation signals. This signal, which appeared on line 32, should be chosen to have a zero phase shift angle. The set output of this flip-flop 68 on line 70 is then a signal having a pulse width proportional to the synchro shaft 14 angle. This signal on line 70 is then fed to a conventional gate device 72 whose other input is the output signal of the 40 MHz oscillator 46 which appeared on line 48. This gating operation in gate 72 has the effect of counting the number of oscillator pulses (on line 48) which will occur within one pulse width of the derived signal on line 70. Such signal then appears at the output of the gate device 72 on line 74 and is fed directly to a conventional BCD counter 76. The output signal on line 28 from the BCD counter 76 is then the synchro shaft 14 angle in BCD form.

Figure 2:
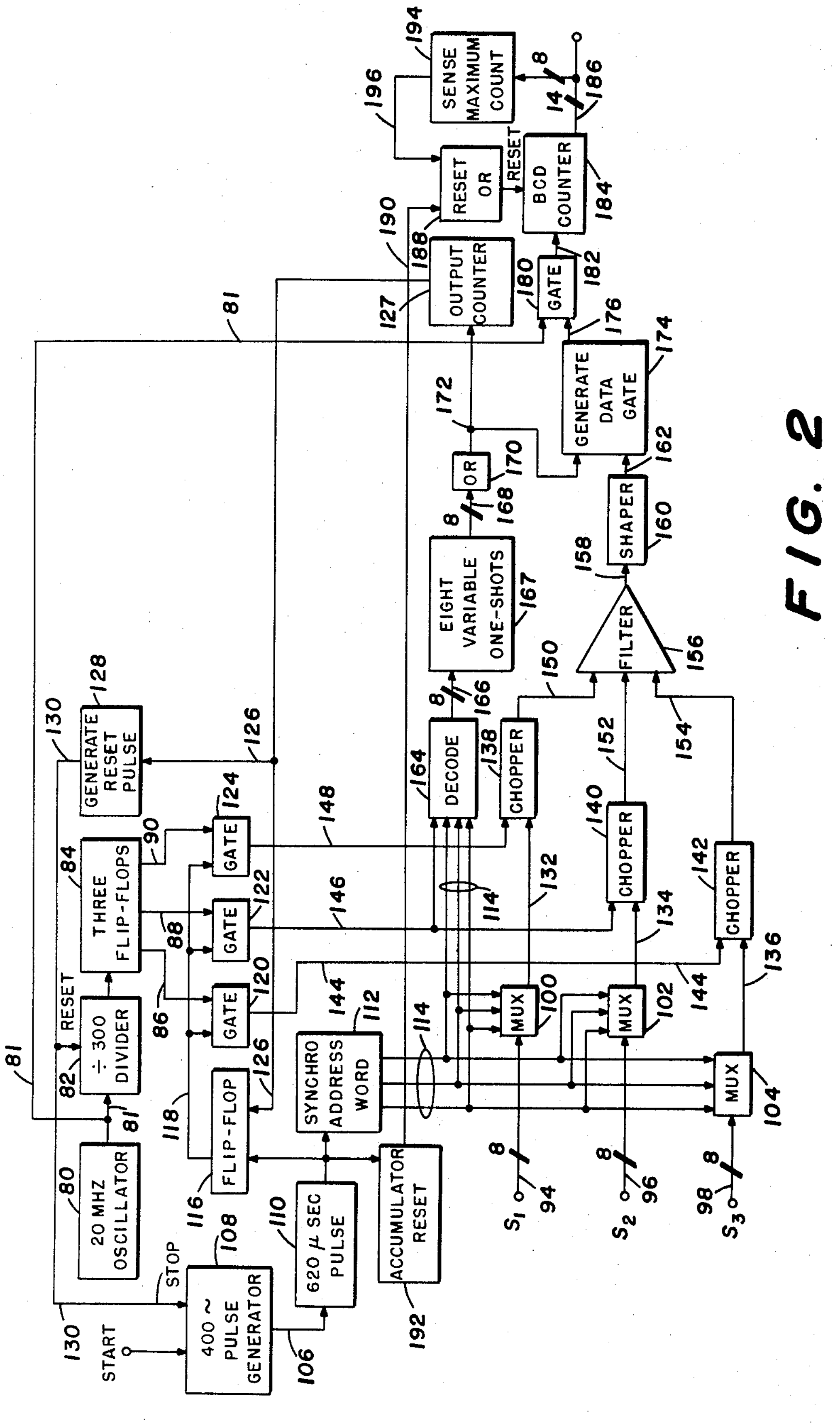
FIG. 2 is a block diagram showing another of the preferred embodiments of the invention.

Referring now to FIG. 2, the invention as depicted in FIG. 1 is shown, but in an embodiment capable of receiving multiple signals from eight separate synchros. A 20 MHz oscillator 80 output signal is connected by line 81 to a divide-by-300 divider unit 82 which could be comprised of a divide-by-5 counter, a divide-by-10 counter and a divide-by16 counter. The output signal from the divide-by-300 divider 82 is fed to a flip-flop module 84 comprised of three flip-flops. These flip-flops 84 are connected in such a way as to produce output signals which are 120° out of phase with each other; these signals are shown on lines 86, 88, 90. Six clock pulses from the divide-by-300 divider 82 will be required for one complete cycle of the flip-flop module 84, with one output (86, 88, or 90) of the three flip-flops 84 going high each two clock pulses. Consequently the 20 MHz signal from the oscillator 80 is further divided down to produce the nominal 10 KHz signal. That is, in FIG. 1 a 40 MHz signal was divided by 3,600, but in the embodiment of FIG. 2 a 20 MHz signal is divided by 1,800 to obtain the same frequency. This embodiment of the invention is capable of receiving output signals, commonly referred to as $S_1$, $S_2$, and $S_3$, from eight separate synchros, these signals are shown on multichannel lines 94, 96, and 98. These input lines 94, 96 and 98 are fed respectively to multiplexers 100, 102, 104 which are of a commercially available type. In order to properly control these multiplexer units 100, 102, 104, a control circuit is provided. A 400 Hz pulse train on line 106, provided by a suitable generator 108, is activated when it is desired to start the conversion. This signal will be subsequently gated off when all eight synchros have been computed. The 400 Hz pulse on line 106 is then fed to another pulse generator 110 which generates a 620 microsecond pulse which is applied to a three-stage binary counter 112 which generates a three-bit synchro input address word appearing on parallel lines 114. This address word is fed, via lines 114, to the multiplex units 100, 102, 104 so that one of the eight synchros may be selected. A three-bit word is capable of providing eight distinct counts, from zero to seven. The 620 microsecond pulse is also used to set a flip-flop 116 which causes a signal to appear on line 118 which is fed to gates 120, 122, 124 for gating ON the phased 10 KHz (nominal) signals 86, 88, and 90. This flip-flop 116 will remain set, i.e., a signal will remain on line 118 until it is reset by a strobe signal on line 126, which will be produced at the end of each synchro conversion by an output counter 127 which senses when each of the eight synchros have been computed. The strobe signal on line 126 is also fed to a differentiator 128 where it is differentiated to generate a reset pulse on line 130 for resetting the divide-by-300 divider 82.

Returning now to the multiplexer units 100, 102, 104, one set of synchro input signals (consisting of an $S_1$ signal from line 94, and $S_2$ signal from line 96 and an $S_3$ signal from line 98) is selected by the synchro address word on line 114 and is passed by the multiplexer units 100, 102, 104 onto lines 132, 134 and 136 respectively. These three signals 132, 134, 136 are fed respectively to chopper units 138, 140, 142. These signals are chopped with the output signals 144, 146, 148 of gates 120, 122, 124. The choppers 138, 140, 142 produce output signals on lines 150, 152, and 154 which are further summed at the inputs of an operational amplifier 156 which has been connected to perform as an active filter. This filter 156 is shown in more detail in following FIG. 3. The operational amplifier 156 output signal on line 158 will then be a sine wave having a phase angle which is proportional to the synchro rotor shaft angle. The signal on line 158 is then fed to a shaper 160 which reproduces the signal as a square wave on line 162.

As pointed out during the general discussion of the invention as shown in FIG. 1, a phased signal at the nominal 10 KHz frequency is used as a reference to produce a signal having a pulse width proportional to the synchro rotor shaft angle. However, when multiple synchros are used, the output signals from each synchro stator may not be precisely identical and a signal with zero phase shift may not be available. To accommodate this contingency, there is provided the capability of producing a small, adjustable phase shift, in order to maintain the apperance of a zero degree phase reference for each of the stator output signals. Returning once again to FIG. 2, this is accomplished by applying the synchro address word on parallel lines 114 (a three-bit word) to the three least significant bit inputs of a four-input, one-out-of-10 output decoder 164. The phased nominal 10 KHz output signal from gate 122 which is known to have a 0° phase shift, and which is on line 146, is then fed to the most significant bit input of the decoder 164. The address word serves to select one of eight possible output lines 166 out of the decoder 164 and the signal on line 146 is now impressed on the selected line. Each of the eight output lines 166 of the decoder 164 is connected to an individually variable one-shot multivibrator, shown collectively as a unit 167. These eight adjustable one-shots 167 are capable of producing eight different output signals (but only one at a time) on an eight conductor parallel line 168, which is connected to an eight input logical OR circuit 170. The OR circuit 170 then produces an output signal on line 172 to provide a 10 KHz (nominal) reference signal which is now tailored to each individual synchro.

These two signals, the variable phase 10 KHz signal on line 162 and the reference phase 10 KHz signal on line 172 are fed to a data gate device 174. This gate 174 produces an output signal on line 176 having a pulse width which is proportional to the phase difference between the two input signals 162, 172. Since the reference signal 172 was chosen to have a 0° phase shift and the phase shift of the derived signal 162 is proportional to the synchro rotor shaft angle, the pulse width of the data gate 174 output signal on line 176 will also be proportional to the rotor shaft angles. The data gate 174 is shown in more detail in FIG. 4, and will be discussed in more detail later.

In order to decode or demodulate the phase angle information contained in the pulse width of the signal on line 176, it is necessary only to determine the number of pulses of clock 80 which could occur in such pulse width. Accordingly, the original 20 MHz oscillator 82 output signal, on line 81, is gated with the information signal 176 in a conventional gate device 180. The output of this gate device 180, on line 182, is a pulse train having a number of pulses which is proportional to the shaft angle in 0.1° increments. To permit visual display, these pulses are then accumulated by four decode BCD counter 184. The output of the BCD counter 184 on line 186 is then the required information concerning the synchro rotor shaft angle. A reset OR circuit 188 is provided and is fed by a signal on line 190 generated by a pulse generator termed an accumulator reset 192. The accumulator reset 192 is triggered by the 620 microsecond pulse generator 110 when the converter is started by signals appearing on line 106. The function of this reset is to clear the BCD counter 184 of old data from the previous synchro conversion in anticipation of new data appearing on line 182. In addition to this reset function, a second input to the reset OR circuit 188 is required. This is due to the fact that since the BCD output on line 186 involves angular information it is desirable to reset the BCD counter 184 upon the occurrence of the maximum signal output, i.e., 360°. A maximum count sensor 194, which may be made up of commercially available logic gates appropriately connected, receives the output signal 186 and upon the occurrence of a count indicative of 360°, produces a pulse on line 196. The reset OR circuit 188 receives this pulse and resets the BCD converter 184 so that it may begin counting degrees again from zero.

Referring now to FIG. 3, which shows the active filter operational amplifier 156 of FIG. 2 in more detail. The three input signals, shown on line 150, 152 and 154, may be combined on line 200 which is connected to an input terminal of a conventional operational amplifier 202. Filtering is provided by a resistosr 204, an inductor 206, a fixed capacitor 208 and a variable capacitor 210 (trimmer) connected in parallel with each other and with the operational amplifier 200. The values of these passive components are chosen such that they will be in parallel resonance at the reference frequency, and will have a Q which is sufficient to filter out unwanted higher harmonics in order to produce the desired phase-shifted sinusoidal wave. The desired output signal appears on line 158, which is then connected to the pulse shaper 150 of FIG. 2.

Figure 4:
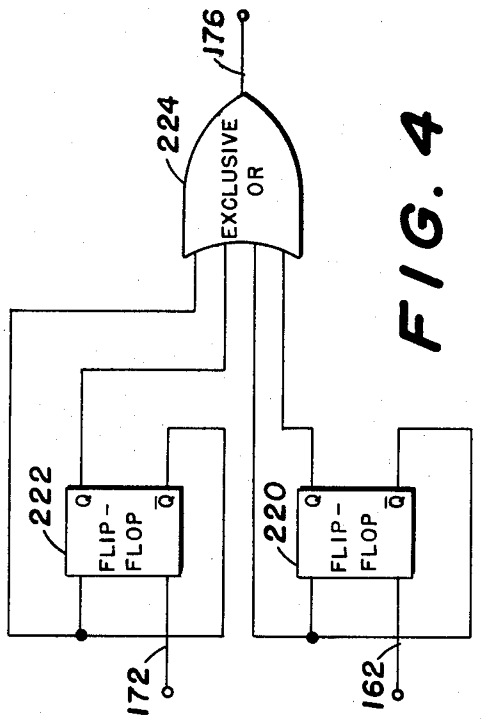
FIG. 4 is a block diagram of a typical data gate generator as employed in the embodiment of FIG. 2.

Referring to FIG. 4, which shows the generate data gate unit, 174 of FIG. 2, in greater detail. The limited, phase shifted, 10 KHz signal on line 162 is used to clock a conventional flip-flop 220, and the reference 10 KHz signal on line 182 is used to clock a second conventional flip-flop 222. These flip-flops 220, 222 are connected in the well-known manner so that they will toggle. The SET and RESET outputs of each flip-flop 220 and 222 are connected to an exclusive OR circuit 224 of the conventional type. This exclusive OR circuit 224 then produces an output signal, on line 176, having a pulse width proportional to any phase difference existing between the two input signals 162 and 172.

It should be understood that the details of the foregoing embodiment are set forth by way of example only. It is contemplated that this invention not be limited by the particular details of the embodiment as shown except as defined in the appended claims.

What is claimed is:

1. In a system having an energized primary winding means and a plurality of secondary winding means physically displaced in phase one from another each having a signal induced thereon dependent upon the angular position of said primary winding means relative to said secondary winding means, a converter for determining said relative angular positions, comprising;

signal generator means producing an output signal of frequency greater than the frequency of said induced signals, means connected to receive said output signal of said generator means and produce therefrom a plurality of phase-shifted output signals having a common frequency lesser than the frequency of the output signal from said signal generator means but greater than the frequency of said induced signals, each of said plurality of phase-shifted output signals from said frequency converter means being shifted in electrical phase relative to one another by an amount equal to said physical phase displacement between associated ones of said plurality of secondary winding means, a plurality of signal chopping means each having inputs connected to receive an induced secondary winding signal and its associated phase shifted signal and each producing an output signal therefrom, summing means having inputs connected to receive said output signals from said plurality of chopping means for producing a summed output signal, pulse generating means connected to receive said summed signal and a preselected one of said phase shifted signals for producing an output signal having a pulse width proportional to the phase difference between said received signals, and gating means connected to receive said output signal from said pulse generating means and said output signal from said signal generator means for producing a pulsed signal having a number of pulses proportional to said relative angular position.

2. The apparatus of claim 1 wherein said means for producing said plurality of phase shifted signals comprises a frequency divider chain.

3. The apparatus of claim 2 wherein said signal chopping means is a field effect transistor.

4. The apparatus of claim 3 wherein said pulse generating means comprises a flip-flop.

5. The apparatus of claim 4 wherein, the frequency of said output signal from said signal generating means is at least two orders of magnitude higher than said induced signal frequency, and preselected one of said phase shifted signals has a 0° phase shift relative to said output signal from said signal generating means.

6. The apparatus of claim 1 wherein said plurality of secondary winding means are the stator windings of a synchro generator and said energized primary winding means comprises the rotor of said synchro generator.

7. In a system containing a plurality of synchro generators each having an energized primary winding means and each having a plurality of secondary winding means physically displaced in phase one from another and having signals impressed thereon dependent upon the angular position of said primary winding means relative to said secondary winding means, a converter for determining said relative angular position of each of said synchro generators, comprising; signal generator means producing an output signal having a frequency greater than the frequency of said impressed signals, means connected to receive said output signal of said generator means and produce therefrom a plurality of phase-shifted output signals having a common frequency lesser than the frequency of the output signal from said signal generator means but greater than the frequency of said induced signals, each of said plurality of phase shifted output signals from said frequency converter means being shifted in eleectrical phase relative to one another by an amount equal to said physical phase displacement between associated ones of said plurality of secondary winding means, addressing means producing a series of coded signals each corresponding to a preselected one of said plurality of synchro generators, multiplexing means connected to receive said plurality of secondary winding signals and responsive to the coded signals produced by said addressing means for producing output signals representing one set of stator signals of said plurality of synchro generators, a plurality of signal chopping means each having inputs connected an output signal from said multiplexing means and its associated phase shifted signal and each producing an output signal therefrom, summing means having inuts connected to receive said output signals from said chopping means for producing a summed output signal, pulse generating means connected to receive said summed signal and a preselected one of said phase shifted signals for producing an output signal having a pulse width proportional to the phase difference between said received signals, and gating means connected to receive said output signal from said pulse generating means and said output signal from said signal generator means for producing a pulsed signal having a number of pulses proportional to said relative angular position.

* * * * *